(12) United States Patent
Hirai et al.

(10) Patent No.: US 8,213,472 B2
(45) Date of Patent: Jul. 3, 2012

(54) OPTICAL TRANSMITTER AND OPTICAL COMMUNICATIONS DEVICE

(75) Inventors: Masahiro Hirai, Yokohama (JP); Takeshi Yamashita, Ninomiya (JP); Hideyuki Kuwano, Fujisawa (JP)

(73) Assignee: Opnext Japan, Inc., Kanagawa (JP)

( * ) Notice: Subject to any disclaimer, the term of this patent is extended or adjusted under 35 U.S.C. 154(b) by 788 days.

(21) Appl. No.: 12/018,484

(22) Filed: Jan. 23, 2008

(65) Prior Publication Data

US 2008/0175601 A1    Jul. 24, 2008

(30) Foreign Application Priority Data

Jan. 24, 2007  (JP) ................................. 2007-013713

(51) Int. Cl.
*H01S 3/04* (2006.01)
(52) U.S. Cl. .......................................... 372/36; 372/34
(58) Field of Classification Search ............... 372/34–36
See application file for complete search history.

(56) References Cited

U.S. PATENT DOCUMENTS

| | | | |
|---|---|---|---|
| 2003/0058907 A1* | 3/2003 | Nasu et al. | 372/34 |
| 2008/0298402 A1* | 12/2008 | Rossi et al. | 372/20 |
| 2009/0252188 A1* | 10/2009 | Rossi et al. | 372/34 |
| 2010/0091804 A1* | 4/2010 | Musio et al. | 372/20 |

FOREIGN PATENT DOCUMENTS

| | | |
|---|---|---|
| JP | 2001-244545 | 9/2001 |
| JP | 20075681 A | 1/2007 |

OTHER PUBLICATIONS

Japanese Office Action dated May 8, 2012, issue in corresponding Japanese Patent Application No. 2007-013713 with partial English language translation.

* cited by examiner

*Primary Examiner* — Jessica Stultz
*Assistant Examiner* — Phillip Nguyen
(74) *Attorney, Agent, or Firm* — Brundidge & Stanger, P.C.

(57) ABSTRACT

Disclosed is an optical transmission module in which effects of conductive heat from sides of a metal case upon a thermistor are reduced, thereby allowing steady optical beam wavelengths to be obtained over a wide range of temperatures, regardless of the temperature of the usage environment. Specifically, the optical transmission module includes Peltier elements disposed inside a metal case, a metal base disposed upon the Peltier elements, a laser diode substrate disposed upon the metal base, a laser diode disposed upon the laser diode substrate, a thermistor substrate disposed upon the metal base, a thermistor disposed upon the thermistor substrate, and a thermally conductive member, disposed in the vicinity of the thermistor, that has a height greater than the height of the thermistor.

5 Claims, 11 Drawing Sheets

Prior Art

Prior Art

US 8,213,472 B2

OPTICAL TRANSMITTER AND OPTICAL COMMUNICATIONS DEVICE

The present application claims a priority from the Japanese patent application No. JP 2007-13713 filed on Jan. 24, 2007, the content of which is hereby incorporated by reference into this application.

BACKGROUND OF THE INVENTION

1. Field of the Invention

The present invention relates to an optical communications module used in a communications device that uses optical fiber. More particularly, the invention relates to a compact, highly-integrated optical transmission module utilizing wavelength-division multiplexing (WDM).

2. Description of the Related Art

Optical transmission systems using wavelength-division multiplexing (WDM) technology are being adopted as a method to economically transmit more information. Wavelength-division multiplexing systems simultaneously use a plurality of optical signals of different wavelengths to multiplex signals on a single optical fiber, thus making it possible to dramatically increase the quantity of information transmitted over optical fiber. These systems utilize the property that optical beams of differing wavelengths are mutually non-interfering. Consequently, it is important that the optical beams in a WDM optical communications module have fixed wavelengths.

However, the emission wavelengths of the electro-absorption (EA) modulator integrated laser diode (hereinafter abbreviated as LD) element used in wavelength-division multiplexing optical transmission modules exhibits a temperature dependency (approximately 0.1 nm/° C.). Consequently, an ATC (automatic temperature control) circuit is used, the ATC comprising temperature detection elements (i.e., a thermistor) and a cooling device using Peltier or similar elements or the like, housed in a metal case. The ATC is used to equalize the temperatures of the thermistor and the LD over a wide temperature range, and thus ensure that the optical beams maintain steady wavelengths.

In addition, other efforts are being made to equalize the temperatures of the thermistor and the LD over a wide temperature range and ensure that the optical beams maintain steady temperatures by using methods such as those of Patent Document 1.

Patent Document 1: JP-A-2001-244545

SUMMARY OF THE INVENTION

Demands for low power consumption and low costs have led in recent years to more compact and more highly integrated optical transmission modules. However, in the method of JP-A-2001-244545, the number of component parts is increased and thus a more compact module cannot be achieved. Moreover, as a result of developments in producing more compact and more highly integrated modules, the distance between the thermistor and the sides of the metal case has become shorter. Due to conductive heat from the sides of the metal case (conductive heat due to the air filling the interior of the metal case), temperature is distributed to the thermistor itself. Thus even if an ATC circuit is used, the temperature of the thermistor and the LD cannot be kept equalized. As a result, it becomes impossible to maintain steady wavelengths over a wide temperature range, particularly at high temperatures.

The present invention was devised in order to solve such problems, and therefore it is an object of the invention to reduce the effects of conductive heat from the sides of the metal case with respect to the thermistor and thereby obtain steady optical beam wavelengths over a wide range of temperatures, regardless of the temperature of the usage environment.

In the present invention that solves the foregoing problems, temperature distribution to the thermistor is prevented from occurring by providing in the vicinity of the thermistor a member that is taller than the height (thickness) of the thermistor.

For example, in a first aspect of the invention, an optical transmission module comprises: a Peltier element provided within a metal case; a metal base arranged on the Peltier element; a laser diode substrate arranged on the metal base; a laser diode arranged on the laser diode substrate; a thermistor substrate arranged on the metal base; a thermistor arranged on the thermistor substrate; and a thermally conductive member provided in the vicinity of the thermistor, the height thereof being taller than the height of the thermistor.

The thermistor may also be arranged in a concave portion provided so as to be impressed into the metal base.

The thermistor may also be arranged on a stepped portion provided on the metal base.

DESCRIPTION OF THE PREFERRED EMBODIMENTS

Embodiments of the invention will now be described with reference to the accompanying drawings.

First Embodiment

Figure 1:
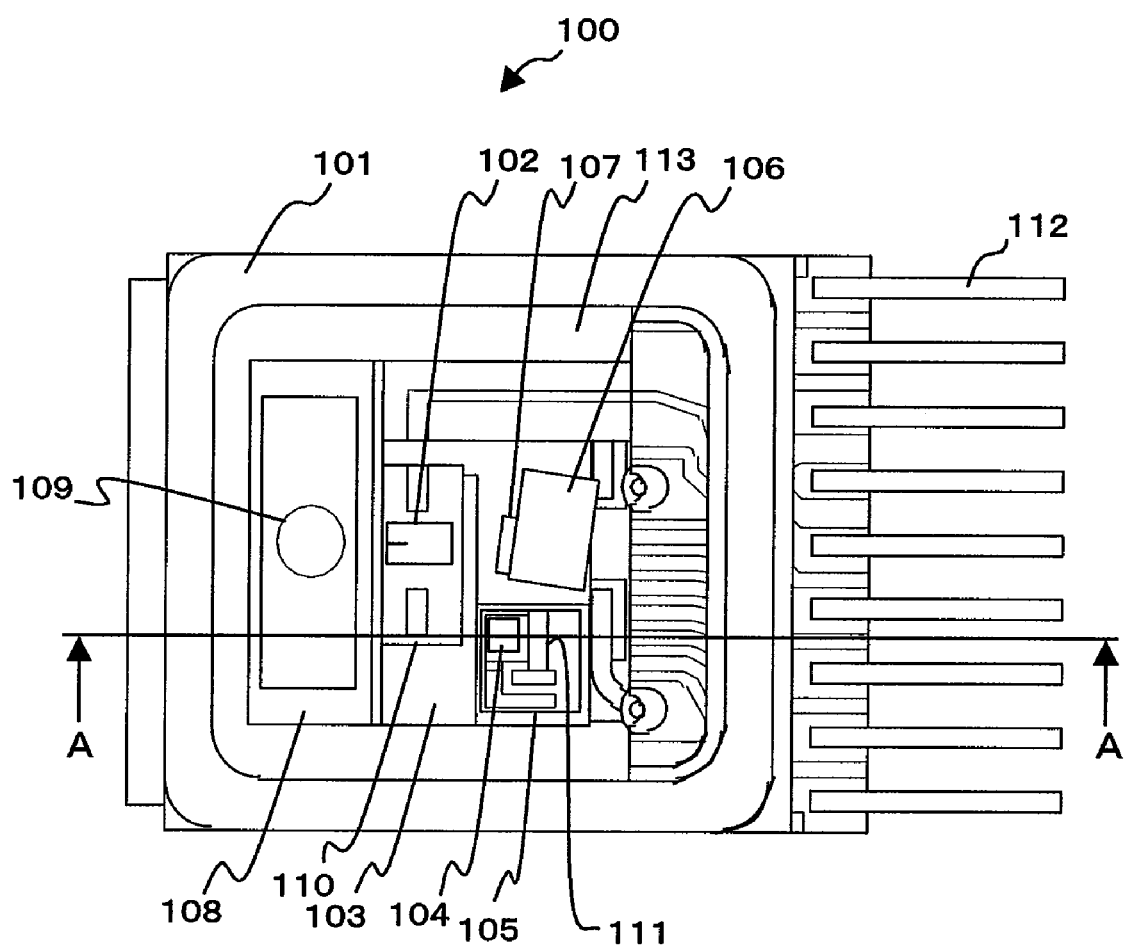
FIG. 1 shows a top view of an optical transmission module in accordance with a first embodiment.
Figure 2:
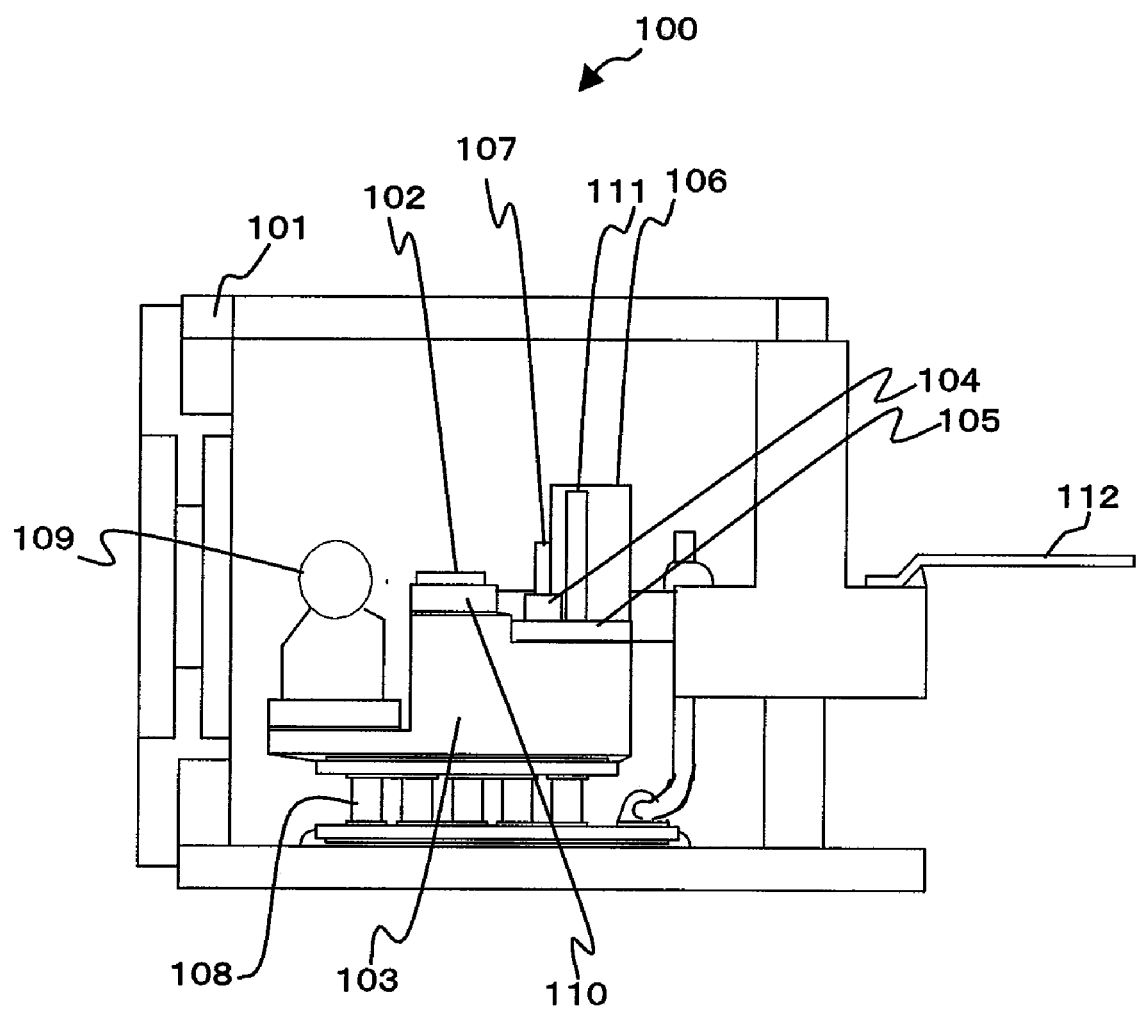
FIG. 2 shows a cross-section view of the optical transmission module in accordance with the first embodiment.

FIG. 1 shows a schematic configuration of an optical transmission module 100 in accordance with a first embodiment. FIG. 2 is a cross-section view taken along a line A in FIG. 1.

The optical transmission module 100 is provided with a metal case 101 and input pins 112.

A relay board 113 having a communications circuit formed thereon is disposed inside the metal case 101.

In addition, inside the metal case 101, a metal base 103 is disposed upon Peltier elements 108.

A laser diode substrate 110 and a lens 109 are installed upon the metal base 103, the laser diode substrate 110 having a laser diode 102 (the light-emitting element) disposed thereon.

In addition, a photodiode substrate 106, with a photodiode 107 disposed thereon, is disposed upon the metal base 103. The photodiode 107 monitors the rearward output light from the laser diode 102.

In addition, a thermistor 104 is disposed upon the metal base 103 via a thermistor substrate 105.

The thermistor 104 comprises elements whose resistance values change according to temperature. By providing these resistance values to the Peltier elements 108 as feedback, an ATC (automatic temperature control) circuit is formed.

Each of these components is connected as necessary using bonding wire (not shown).

A flat, rectangular-bodied, thermally conductive member (a substrate board, metal block, etc.) 111 having a height that is significantly greater than the height of the thermistor 104 is disposed uprightly in the vicinity of the thermistor 104. The thermally conductive member 111 may for example be disposed uprightly in any of the four areas formed between the thermistor 104 and the sides of the metal case 101.

It is preferable for the height of the thermally conductive member 111 to be greater than the height (thickness) of the thermistor 104 by at least a factor of two. Specifically, an AlN substrate having a height four times that of the thermistor 104 is disposed between the thermistor 104 and a side of the metal case 101.

In this way, by providing in the vicinity of the thermistor 104 a thermally conductive member 111 whose height is sufficiently greater than the height of the thermistor 104, the thermistor 104 can be situated inside a temperature distribution spreading from the thermally conductive member 111.

In so doing, the effects of conductive heat from the sides of the metal case 101, with respect to the thermistor 104 (specifically, heat conducted by gas filling the interior of the metal case 101) are reduced as compared to cases wherein nothing is provided in the vicinity of the thermistor 104.

Figure 3:
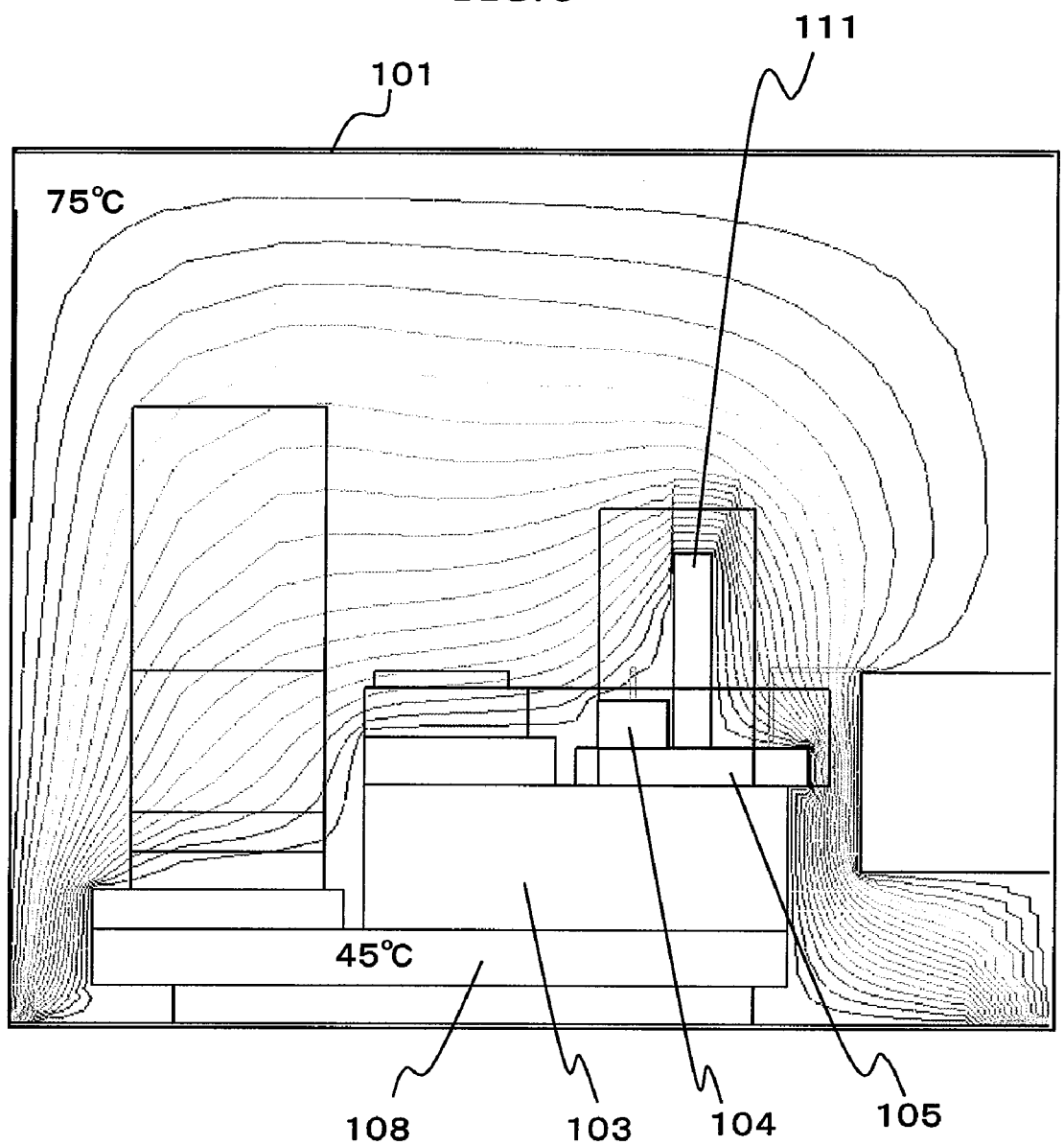
FIG. 3 shows a temperature distribution diagram of the optical transmission module in accordance with the first embodiment.

FIG. 3 shows a temperature distribution diagram inside the metal case 101 of the optical transmission module 100. The diagram shows cases wherein the temperature of the Peltier elements 108 is 45° C. and the temperature of the metal case 101 is 75° C.

As shown in the figure, it is apparent that temperature is not distributed to the thermistor 104, and that the thermistor 104 is situated within a temperature distribution of fixed temperature (in this case, 45° C.).

As a result of the optical transmission module 100 of the present embodiment, the temperature of the thermistor is kept fixed over a wide temperature range, regardless of the temperature of the usage environment. Thus, steady optical beam wavelengths can be obtained over a wide temperature range.

Second Embodiment

Figure 4:
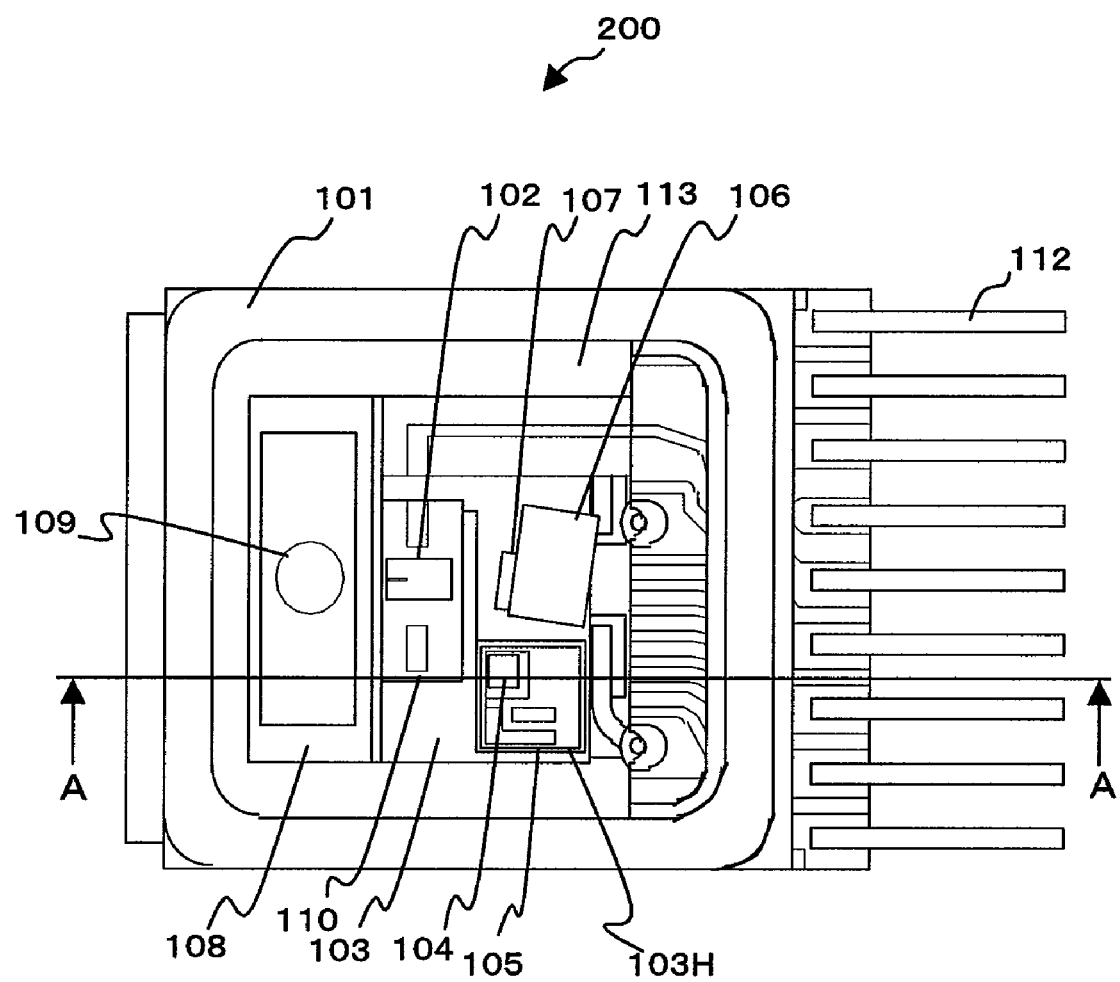
FIG. 4 shows a top view of an optical transmission module in accordance with a second embodiment.
Figure 5:
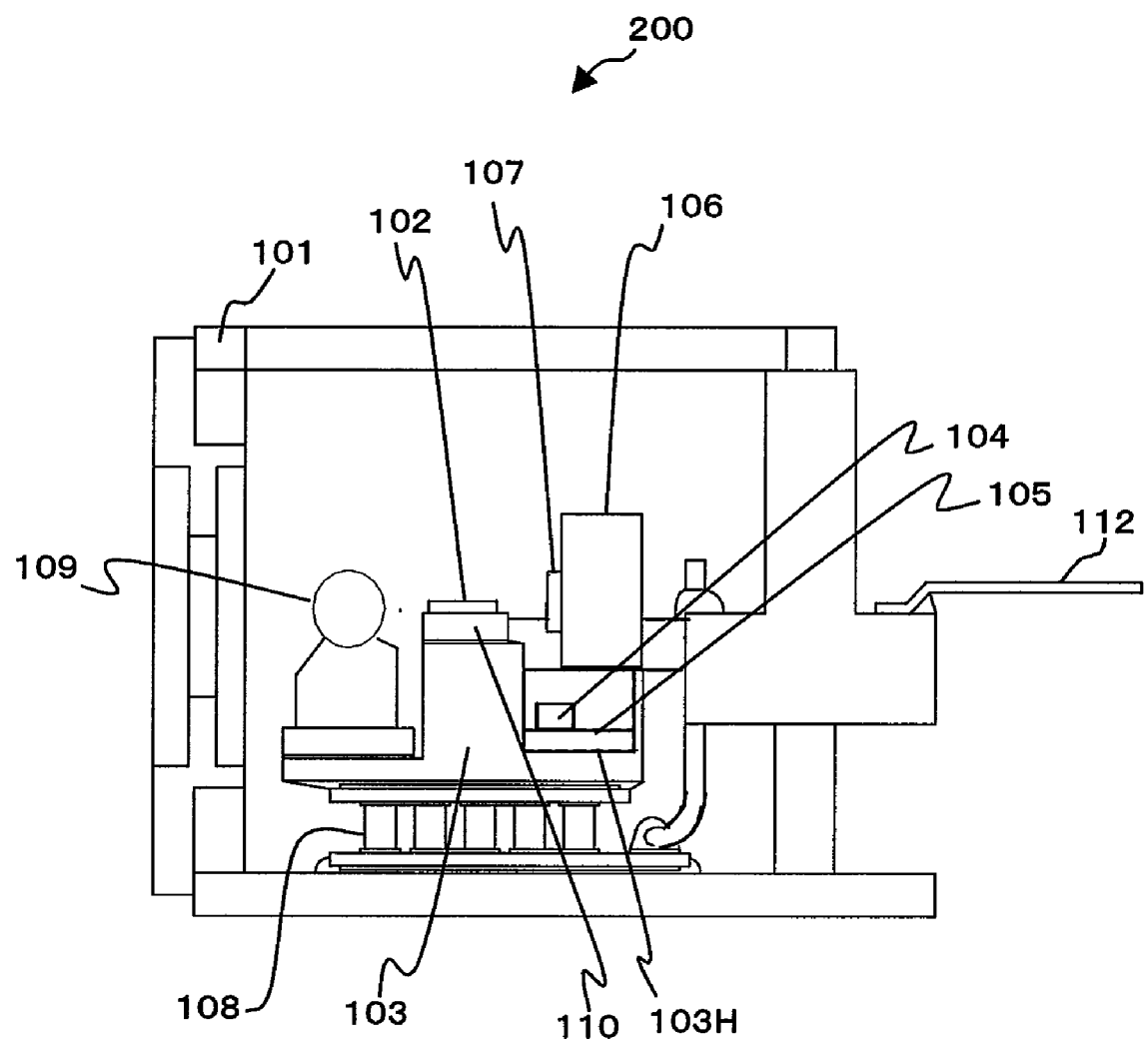
FIG. 5 shows a cross-section view of the optical transmission module in accordance with the second embodiment.

FIG. 4 shows a schematic configuration of an optical transmission module 200 in accordance with a second embodiment. FIG. 5 is a cross-section view taken along a line A in FIG. 4.

Configurations and functions of each component are similar to those of the first embodiment above, and thus their description will be omitted herein for the sake of brevity. In addition, the same components are indicated with the same reference numbers.

In the first embodiment above, a thermally conductive member 111 was disposed in the vicinity of the thermistor 104 in order to prevent the distribution of temperature to the thermistor 104. By contrast, in the present embodiment, the metal base 103 is deeply impressed at a location on the metal base 103 where the thermistor substrate 105 is to be disposed, thereby forming a concave portion 103H that is walled-in on four sides. The thermistor substrate 105 is disposed in this concave portion 103H.

It is preferable for the impression depth to be at least twice the height (thickness) of the thermistor 104. Specifically, the impression depth (excluding the portion corresponding to the thickness of the thermistor substrate 105) is made to be 3 to 5 times the height (thickness) of the thermistor 104.

By so doing, the thermistor 104 is surrounded on four sides by the metal base 103. Moreover, the thermistor 104 is situated within the temperature distribution spreading from the metal base 103.

By so doing, the effects of conductive heat from the sides of the metal case 101, with respect to the thermistor 104 (specifically, heat conducted by gas filling the interior of the metal case 101) are reduced as compared to cases in which nothing is provided in the vicinity of the thermistor 104.

According to the optical transmission module 200 of the present embodiment, the temperature of the thermistor is kept fixed over a wide temperature range, regardless of the temperature of the usage environment. Thus, steady optical beam wavelengths can be obtained over a wide temperature range.

Third Embodiment

Figure 6:
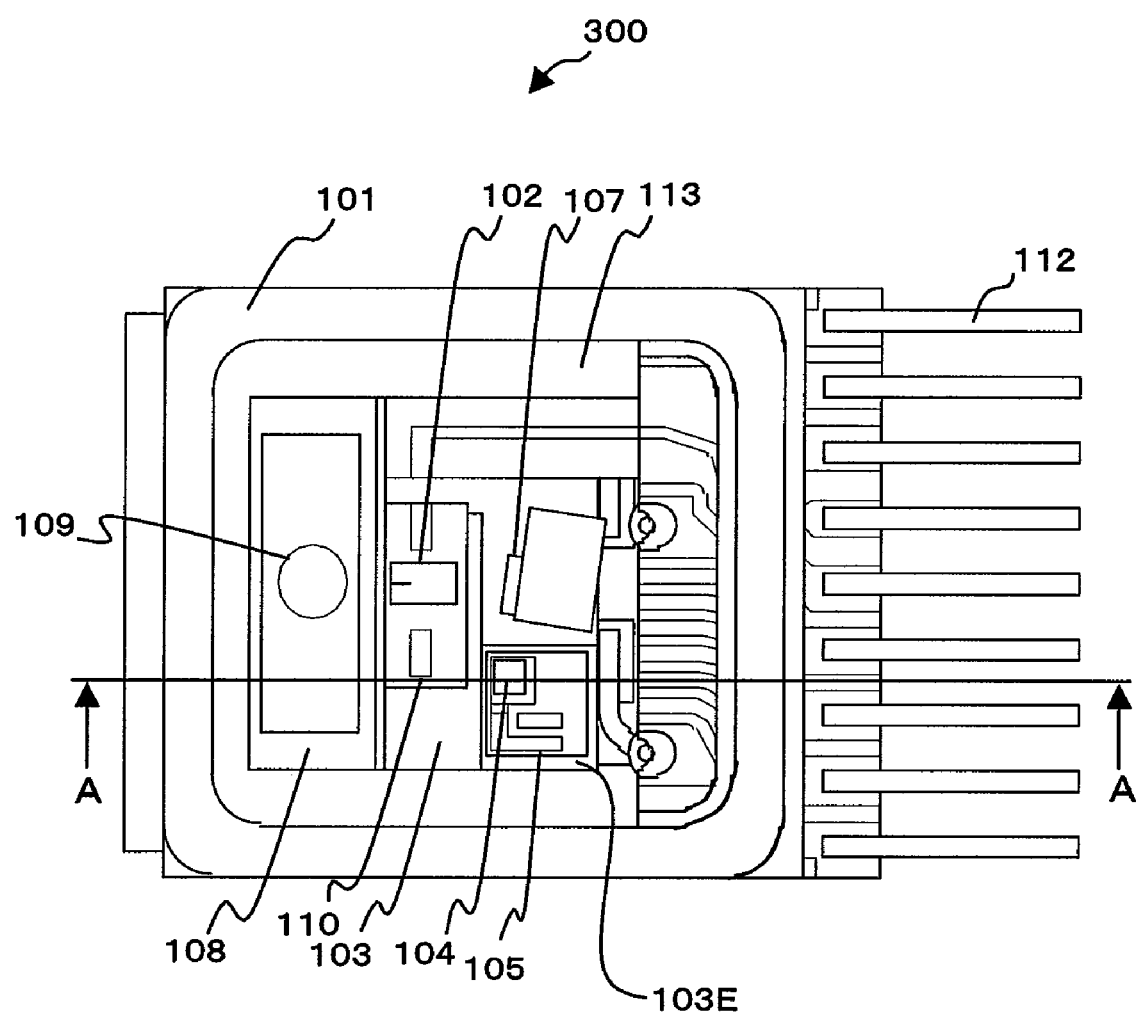
FIG. 6 shows a top view of an optical transmission module in accordance with a third embodiment.
Figure 7:
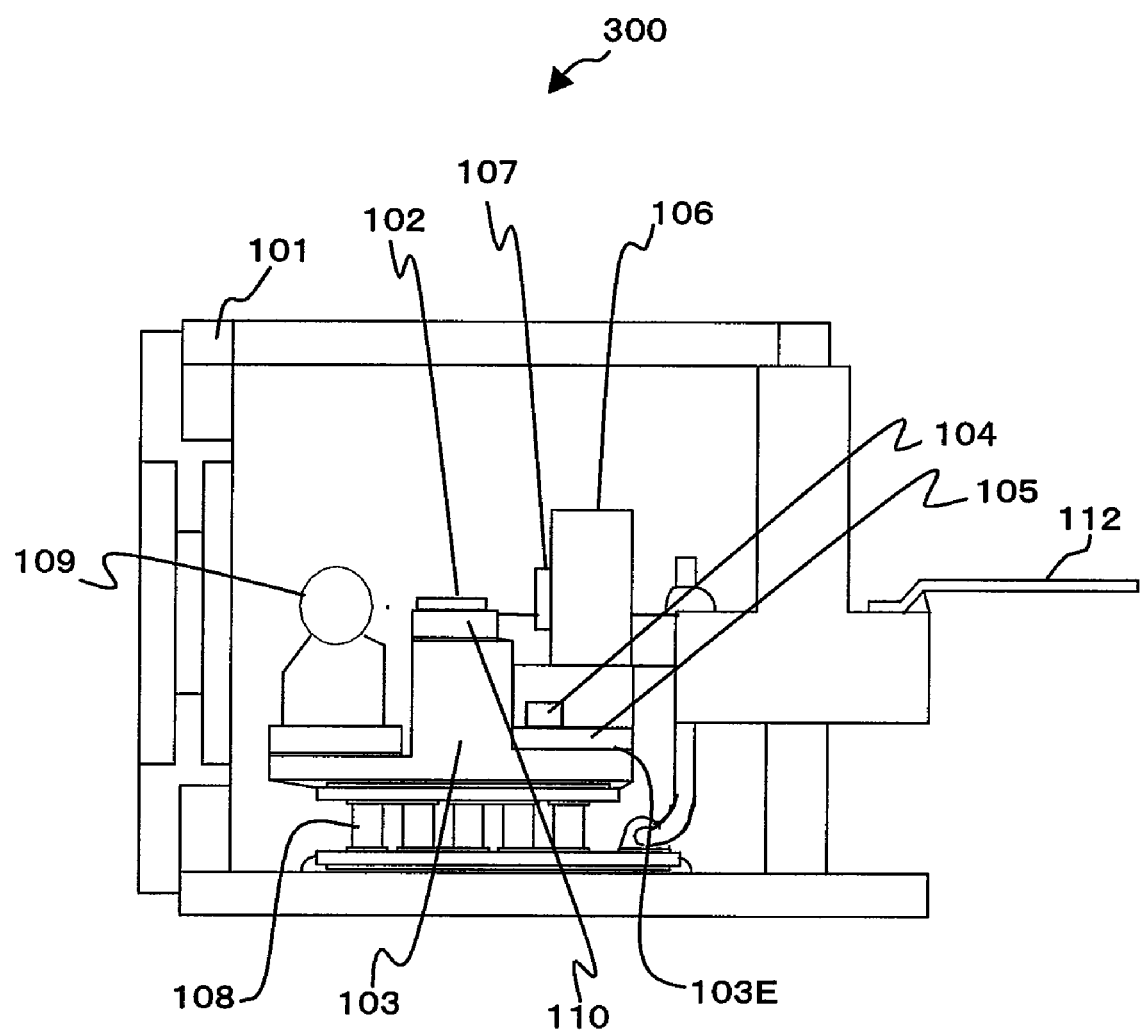
FIG. 7 shows a cross-section view of the optical transmission module in accordance with the third embodiment.

FIG. 6 shows a schematic configuration of an optical transmission module 300 in accordance with a third embodiment. FIG. 7 is a cross-section view taken along a line A in FIG. 6.

Configurations and functions of each component are similar to those of the first and second embodiments above, and thus their description will be omitted herein for the sake of brevity. In addition, the same components are indicated with the same reference numbers.

In the second embodiment above, the metal base 103 was deeply impressed in order to dispose the thermistor substrate 105 in the depression formed thereby. By contrast, in the present embodiment, a stepped portion 103E is provided on the metal base 103, and the thermistor substrate 105 is disposed on this stepped portion 103E.

Figure 8:
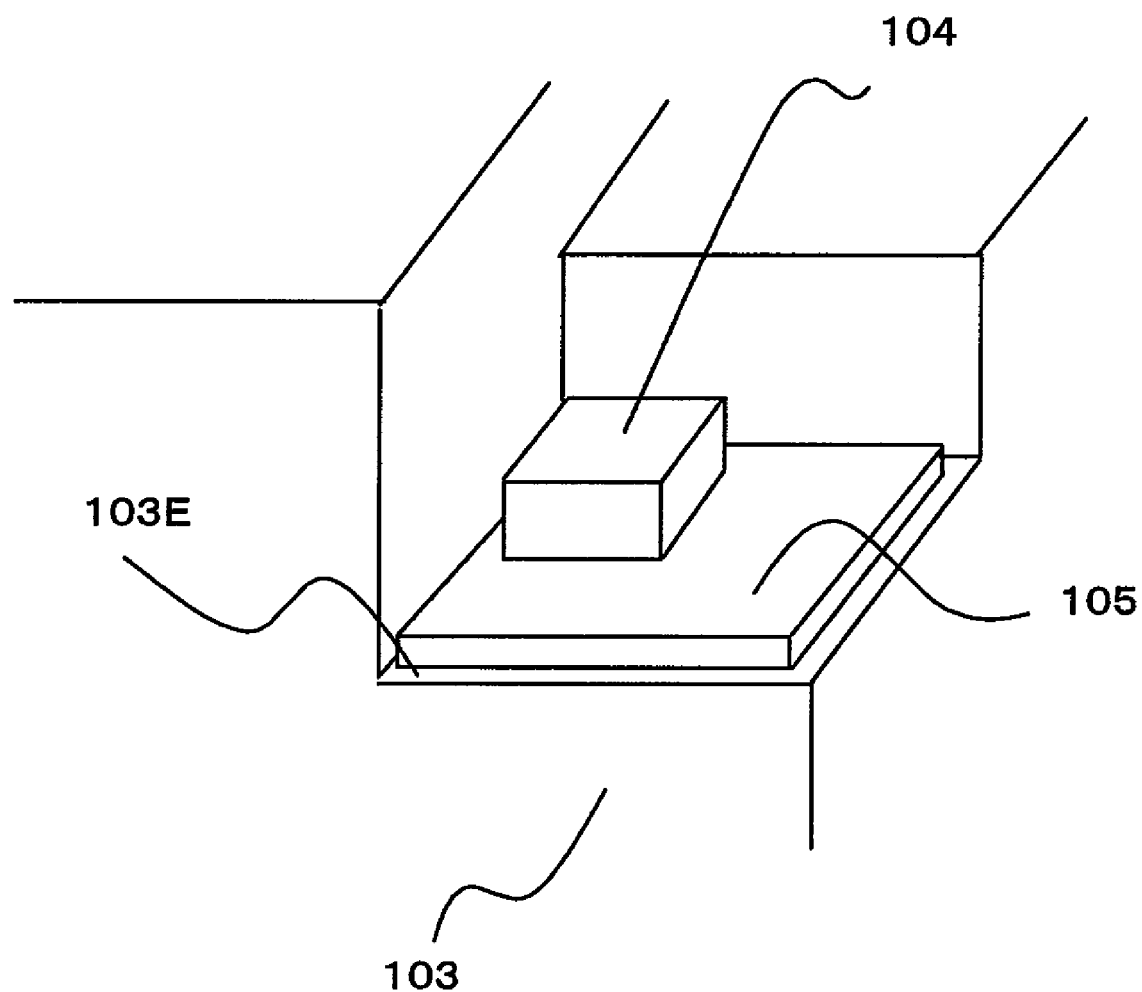
FIG. 8 shows a partially enlarged perspective view of the optical transmission module in accordance with the third embodiment.

FIG. 8 is a partially enlarged perspective view for describing this stepped portion 103E.

It is preferable for the depth (step height) of the stepped portion 103E to be at least twice the height (thickness) of the thermistor 104. Specifically, the depth of the stepped portion 103E (excluding the portion corresponding to the thickness of the thermistor substrate 105) is made to be 3 to 5 times the height (thickness) of the thermistor 104.

By so doing, a wall formed by the metal base 103 is created on at least one side of the thermistor 104. Moreover, the thermistor 104 is situated inside the temperature distribution spreading from the metal base 103.

By so doing, the effects of conductive heat from the sides of the metal case 101 with respect to the thermistor 104 (specifically, heat conducted by gas filling the interior of the metal case 101) are reduced as compared to cases in which nothing is provided in the vicinity of the thermistor 104.

According to the optical transmission module 300 of the present embodiment, the temperature of the thermistor is kept fixed over a wide temperature range, regardless of the temperature of the usage environment. Thus, steady optical beam wavelengths can be obtained over a wide temperature range.

The several embodiments have been thus described.

Figure 9:
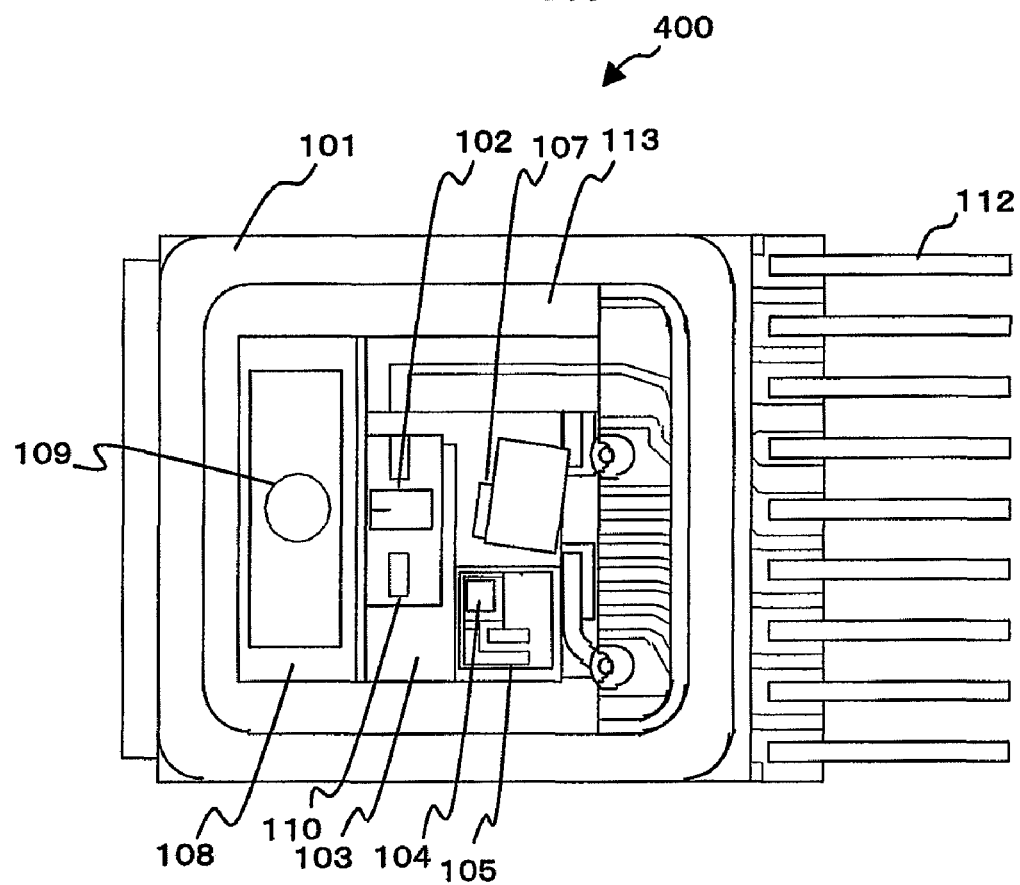
FIG. 9 shows a top view of an optical transmission module of the conventional art.
Figure 10:
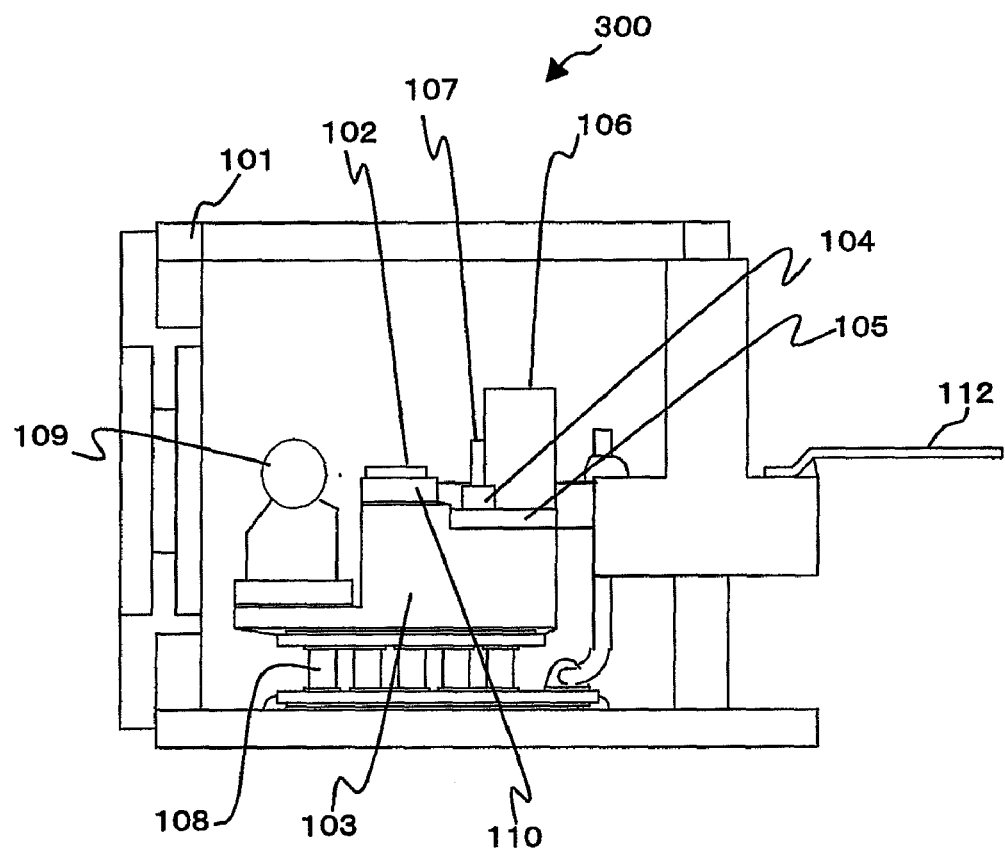
FIG. 10 shows a cross-section view of a conventional optical transmission module.
Figure 11:
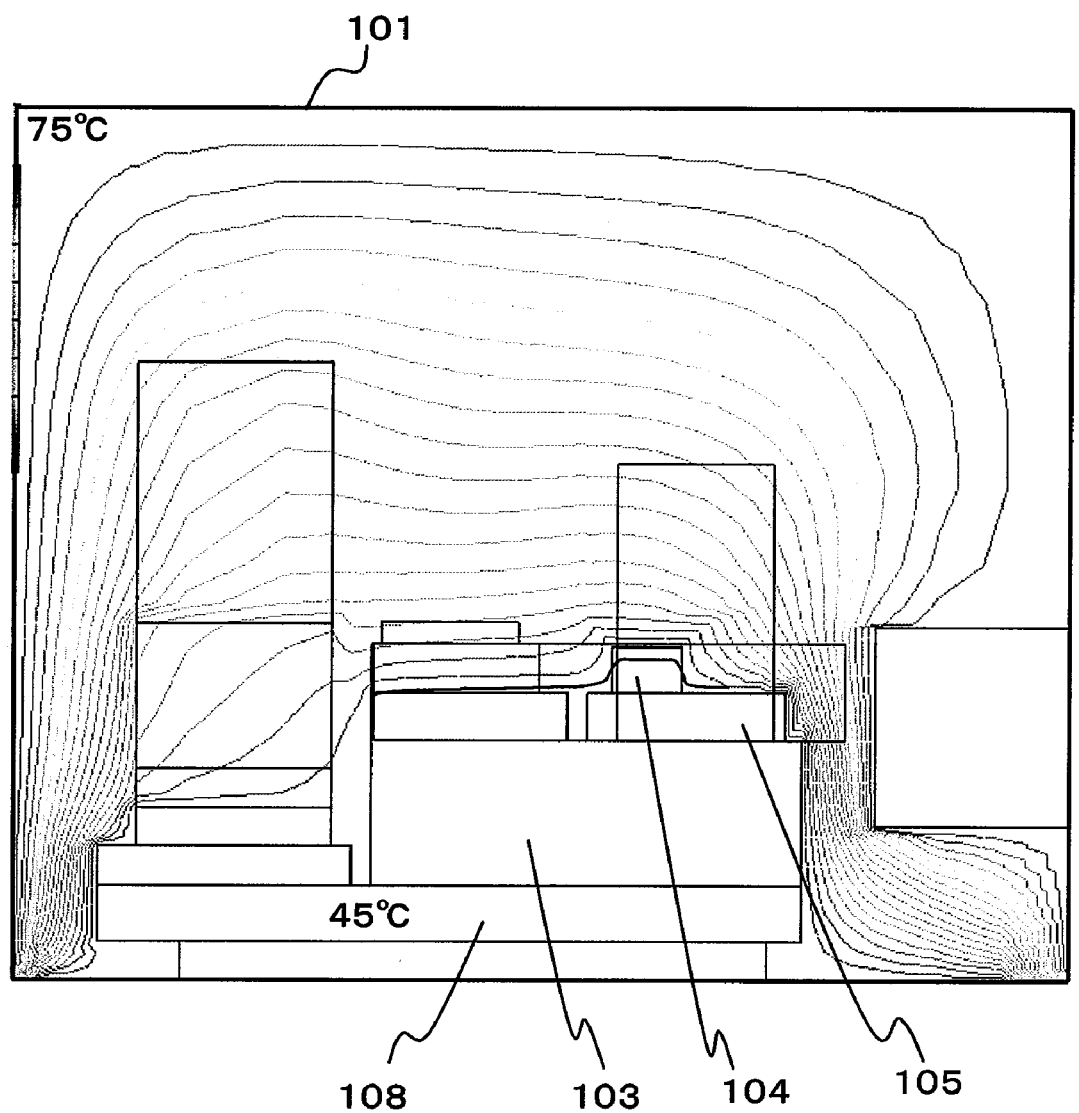
FIG. 11 shows a temperature distribution diagram of a conventional optical transmission module.

In a conventional optical transmission module 400, shown in FIGS. 9 and 10, temperature is distributed to a thermistor 104 as shown in a temperature distribution diagram in FIG.

11. By contrast, in the embodiments of the present invention, generation of this temperature distribution is reduced. Thus, steady optical beam wavelengths are obtained over a wide temperature range using a simple method. Consequently, it is possible to provide an optical transmission module and an optical communications device suitable for WDM.

While we have shown and described several embodiments according to the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. An optical transmission module, comprising:
   a Peltier element disposed inside a metal case;
   a metal base disposed upon the Peltier element;
   a laser diode substrate disposed upon the metal base;
   a laser diode disposed upon the laser diode substrate;
   a thermistor substrate disposed upon the metal base;
   a thermistor for making an automatic temperature control feedback circuit with the Peltier element, the thermistor being disposed upon the thermistor substrate; and
   a thermally conductive member having a height greater than the height of the thermistor, and disposed in the vicinity of the thermistor,
   wherein the temperature of the laser diode is controlled by the Peltier element, and
   wherein said thermally conductive member is a metal block or a substrate board having a thermal conductivity higher than or equal to that of AlN.

2. The optical transmission module according to claim 1, wherein:
   the thermally conductive member has a height at least twice the height of the thermistor.

3. An optical communications device comprising the optical transmission module according to claim 1.

4. The optical transmission module according to claim 1, wherein the thermistor is disposed within a temperature distribution of fixed temperature spreading from the thermally conductive member such that the thermally conductive member prevents heat from the metal case from being distributed to the thermistor.

5. The optical transmission module according to claim 2, wherein the thermally conductive member has a height four times the height of the thermistor.

* * * * *